(12) United States Patent
Huang

(10) Patent No.: US 7,492,977 B2
(45) Date of Patent: Feb. 17, 2009

(54) ALL-FIBER CURRENT SENSOR

(76) Inventor: Yong Huang, 1079 Sandalwood La., Milpitas, CA (US) 95035

( * ) Notice: Subject to any disclaimer, the term of this patent is extended or adjusted under 35 U.S.C. 154(b) by 0 days.

(21) Appl. No.: 12/075,517

(22) Filed: Mar. 11, 2008

(65) Prior Publication Data
US 2008/0310791 A1   Dec. 18, 2008

Related U.S. Application Data

(60) Provisional application No. 60/934,574, filed on Jun. 14, 2007.

(51) Int. Cl.
*G02B 6/00* (2006.01)
*G02B 6/12* (2006.01)
*G02B 6/10* (2006.01)
*G02B 6/26* (2006.01)

(52) U.S. Cl. .............................. 385/11; 385/12; 385/14; 385/39; 385/41; 385/42; 385/43; 385/44; 385/45; 385/129; 385/130; 385/131; 385/132

(58) Field of Classification Search .................... 385/11, 385/12, 14, 39, 41–45, 129–32
See application file for complete search history.

(56) References Cited

U.S. PATENT DOCUMENTS

| | | | |
|---|---|---|---|
| 5,479,094 A * | 12/1995 | Esman et al. ................. 324/96 |
| 6,188,811 B1 | 2/2001 | Blake |
| 6,636,321 B2 | 10/2003 | Bohnert |
| 7,046,867 B2 * | 5/2006 | Bohnert et al. ................. 385/12 |
| 7,075,286 B2 | 7/2006 | Bohnert |

* cited by examiner

*Primary Examiner*—Frank G Font
*Assistant Examiner*—Mary A El Shammaa

(57) ABSTRACT

Embodiments of the present invention provide a current sensing device. The current sensing device includes, inter alia, a three-by-three (3×3) optical coupler made of polarization-maintaining (PM) fibers and thus being a PM fiber coupler; a light source and at least one photon-detector connected to a first side of the 3×3 PM fiber coupler; and a fiber coil connected to a second side of the 3×3 PM fiber coupler. The 3×3 PM fiber coupler is adapted to split an input light from the light source into first and second optical signals while maintaining their respective polarization directions; and is adapted to cause coherent interference of third and fourth optical signals, related respectively to the first and second optical signals and received from the fiber coil.

19 Claims, 4 Drawing Sheets

ALL-FIBER CURRENT SENSOR

CROSS REFERENCE TO RELATED APPLICATION

This application claims priority of a provisional U.S. patent application Ser. No. 60/934,574, filed Jun. 14, 2007, entitled "All-Fiber Current Sensor", the content of which is incorporated herein by reference in its entirety.

FIELD OF THE INVENTION

The present invention relates to method and apparatus for sensing electric current, and in particular, to an all-fiber current sensor incorporating a three-by-three (3×3) polarization-maintaining fiber coupler.

BACKGROUND

It is well known in the art that electric current may be detected or measured by, for example, a current transducer. However, it is generally complicated, and often expensive, to make such a current transducer that will be able to withstand severe conditions such as, for example, a very high voltage environment under which the transducer may be used. The difficulties come mainly from the fact, among others, that materials used in a traditional current transducer are generally not capable of providing adequate electrical insulation for the transducer.

On the other hand, silica, being widely used in making optical fibers, is by nature a very good electrical insulator, or insulation material, under conditions of even extreme high voltages. Therefore, intuitively a current sensor made of optical fibers shall be able to operate under most, if not all, practically possible voltage conditions such as, for example, high voltage conditions where a traditional current transducer may not be able to operate and/or function properly. For this reason, along with considerations for other economic and technical benefits, current sensors based on fiber-optic have long been considered as good alternatives to the traditional current transducers.

A fiber-optic based current sensor works in the principle of the well-known Faraday effect. Specifically, a current propagating inside a wire or conductor generally will induce a magnetic field around the wire or conductor. Assuming an optical fiber is wound around the current-carrying wire or conductor, the magnetic field, through Faraday effect, may cause rotation of polarization direction of a light traveling inside the optical fiber. According to Faraday's law, the amount of rotation of polarization direction is directly proportional to the magnitude of electric current carried by the conductor or wire, as well as the total length of optical path traversed by the light. Therefore, by injecting a light with a pre-defined linear polarization state into a fiber situated in a sensing region (i.e., the magnetic field region) of the wire or conductor, and subsequently analyzing and/or measuring the polarization state of the light exiting from the sensing region, theoretically the amount of current carried by the wire or conductor may be determined. However, the magnitude of rotation of polarization direction is usually so small that detection of polarization rotation is seldom carried out in a direct fashion. Instead, a fiber-optic based current sensor usually employs a configuration of Sagnac interferometry for the detection of polarization rotation.

A Sagnac interferometry based fiber-optic current sensor operates under the principle of converting rotation of polarization state (or direction) of light into phase changes, that is, converting changes in a space domain into changes in a time domain, and detecting the phase changes using a Sagnac interference circuit. For example, a Sagnac interferometry based fiber-optic current sensor normally includes a fiber coil of one or more turns, and two quarter-wave plates attached to the input and output ports of the fiber coil. A linearly polarized light launched into a first quarter-wave plate may be converted into a circularly polarized light. While propagating through the fiber coil, the circularly polarized light may experience a rotation of polarization direction, in response to magnitude of a current being detected. The circularly polarized light may then be converted back into a linearly polarized light by a second quarter-wave plate with a phase shift.

As is well known in the art, in a conventional fiber-optic current sensor incorporating a two-by-two (2×2) optical coupler, an optical signal may be launched into an input port of the 2×2 optical coupler. The 2×2 optical coupler may split the optical signal into first and second linearly polarized lights. The two linearly polarized lights may subsequently become two circularly polarized lights, after propagating through two quarter-wave plates, and enter a fiber coil separately through the two ends or terminals of the fiber coil to propagate in opposite directions. After experiencing respective polarization rotation and exiting from the opposite end of the fiber coil, the first and second circularly polarized lights may be converted back into linearly polarized lights by the two quarter-wave plates. The two newly converted linearly polarized lights, carrying different phases corresponding to changes in polarization directions, may be launched into the 2×2 optical coupler for Sagnac interference. A resulting interfering signal may be used to estimate the magnitude of electric current under detection.

When an optical signal is launched into a 2×2 fiber coupler and splitted into two lights with one propagating along a throughput port and one propagating along a crossover port, a 90-degree phase difference is inherently added between the two output lights. In a traditional fiber-optic current sensor employing a 2×2 fiber coupler, in order to create effective coherent interference between two input lights, an additional phase shift needs to be added to the 2×2 fiber coupler to avoid its non-sensitive operating point of interference. This may be achieved by letting one of the input lights passing through a phase shift element. However, extra manufacturing complexity and additional device cost will be involved.

Conventional three-by-three (3×3) fiber couplers such as, for example, those made of conventional non-polarization maintaining fibers have also been used in the configuration of fiber current sensors. However, because a conventional 3×3 fiber coupler is not capable of properly maintaining polarization state of optical signal propagating inside, fiber-optic current sensors employing conventional 3×3 fiber couplers exhibit unstable performance due to, at least partially, uncertainty of the polarization state of light inside, and therefore have limited values in practice.

Therefore, there is a need in the art to develop solutions that will address above-mentioned shortcomings of present fiber-optic current sensors.

SUMMARY

Embodiments of the present invention provide a device, specifically a current sensing device, and more specifically an all-fiber current sensor that includes a three-by-three (3×3) polarization-maintaining (PM) fiber coupler; a light source and at least one photon-detector connected to a first side of the 3×3 PM fiber coupler; and a fiber coil connected to a second side of the 3×3 PM fiber coupler.

According to one embodiment, the 3×3 PM fiber coupler is adapted to split an input light from the light source into first and second optical signals, while maintaining their respective polarization directions, and couple the first and second optical signals into the fiber coil; and is adapted to cause coherent interference of third and fourth optical signals. The coherent interference is detected by the photon-detector. The third and fourth signals are related respectively to the first and second optical signals and received from the fiber coil.

According to another embodiment, the device may also include a first quarter-wave plate connected between a first end of the fiber coil and a first port of the second side of the 3×3 PM fiber coupler; and a second quarter-wave plate connected between a second end of the fiber coil and a second port of the second side of the 3×3 PM fiber coupler. The first and second quarter-wave plates are adapted to convert the first and second optical signals into first and second circularly polarized lights respectively, to provide to the fiber coil; the fiber coil is adapted to convert the first and second circularly polarized lights propagating therein in opposite directions into third and fourth circularly polarized lights respectively; and the first and second quarter-wave plates are additionally adapted to convert the third and fourth circularly polarized lights, from the fiber coil, into the third and fourth optical signals respectively, and wherein a third port of the second side of the 3×3 PM fiber coupler is treated with an anti-reflection coating.

According to a further embodiment, the device may include a first polarizer connected between the first quarter-wave plate and the first port of the second side of the 3×3 PM fiber coupler; and a second polarizer connected between the second quarter-wave plate and the second port of the second side of the 3×3 PM fiber coupler. The first polarizer is adapted to convert the first optical signal into a first linearly polarized light, and the second polarizer is adapted to convert the second optical signal into a second linearly polarized light.

According to yet another embodiment, the at least one photon-detector of the device is a first photon-detector connected to a first port of the first side of the 3×3 PM fiber coupler. The device may also include a second photon-detector connected to a second port of the first side of the 3×3 PM fiber coupler, and a signal processor connected to the first and second photon-detectors. The signal processor is adapted to process photocurrents received from the first and second photon-detectors, thereby determining an amount of electric current that passes through an area surrounded by the fiber coil.

According to yet a further embodiment, the device may include a first polarizer connected between the first photon-detector and the first port of the first side of the 3×3 PM fiber coupler; a second polarizer connected between the second photon-detector and the second port of the first side of the 3×3 PM fiber coupler, and a third polarizer connected between the light source and a third port of the first side of the 3×3 PM fiber coupler. In one embodiment, the 3×3 PM fiber coupler may include monolithically fused PM fibers, and include a phase difference between at least two of multiple input/output ports of the first and second sides, and the phase difference may be substantially close to 120 degrees. In another embodiments, the phase difference may be substantially close to 0 degree.

According to one embodiment, the device may include a quarter-wave plate connected between the fiber coil and the second side of the 3×3 PM fiber coupler. The quarter-wave plate is adapted to convert the first and second optical signals into first and second circularly polarized lights respectively, to provide to the fiber coil; the fiber coil is adapted to convert the first and second circularly polarized lights into third and fourth circularly polarized lights respectively; and the quarter-wave plate is additionally adapted to convert the third and fourth circularly polarized lights, back from the fiber coil, into the third and fourth optical signals respectively.

According to another embodiment, the quarter-wave plate is connected to a first end of the fiber coil, and a second end of the fiber coil is coated with a highly reflective material causing increase in back-reflections of light at the second end of the fiber coil.

According to a further embodiment, the device may include a polarization beam splitter (PBS) connected between the quarter-wave plate and first and second ports of the second side of the 3×3 PM fiber coupler, the PBS is adapted to couple and/or split optical signals of first and second polarization directions. The first and second ports of the second side of the 3×3 PM fiber coupler are connected to the PBS in such a way that the PBS is adapted to couple the first and second optical signals to the fiber coil at the first and second polarization directions, and split the third and fourth optical signals from the fiber coil into the first and second ports of the second side of the 3×3 PM fiber coupler at the first and second polarization directions. For example, the first port of the second side of the 3×3 PM fiber coupler is connected to the PBS through a substantially 90-degree rotation of polarization direction, and the second port of the second side of the 3×3 PM fiber coupler is connected to the PBS through a substantially 0-degree rotation of polarization direction.

According to yet another embodiment, the device may include a first polarizer connected between a first port of the PBS and the first port of the second side of the 3×3 PM fiber coupler; and a second polarizer connected between a second port of the PBS and the second port of the second side of the 3×3 PM fiber coupler. The first polarizer is adapted to convert the first optical signal into a first linearly polarized light to launch into the first port of the PBS in the first polarization direction, and the second polarizer is adapted to convert the second optical signal into a second linearly polarized light to launch into the second port of the PBS in the second polarization direction.

BRIEF DESCRIPTION OF THE DRAWINGS

The present invention will be understood and appreciated more fully from the following detailed description of embodiments of the invention, taken in conjunction with the accompanying drawings of which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS

In the following detailed description, numerous specific details are set forth in order to provide a thorough understanding of embodiments of the invention. However it will be understood by those of ordinary skill in the art that embodiments of the invention may be practiced without these specific details. In other instances, well-known methods and procedures have not been described in detail so as not to obscure the embodiments of the invention.

Some portions of the detailed description in the following are presented in terms of algorithms and symbolic representations of operations on electrical and/or electronic signals, and optical signals. These algorithmic descriptions and representations may be the techniques used by those skilled in the electrical and electronic engineering and optical communication arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or electronic or optical signals capable of being stored, transferred, combined, compared, converted, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

Figure 1:
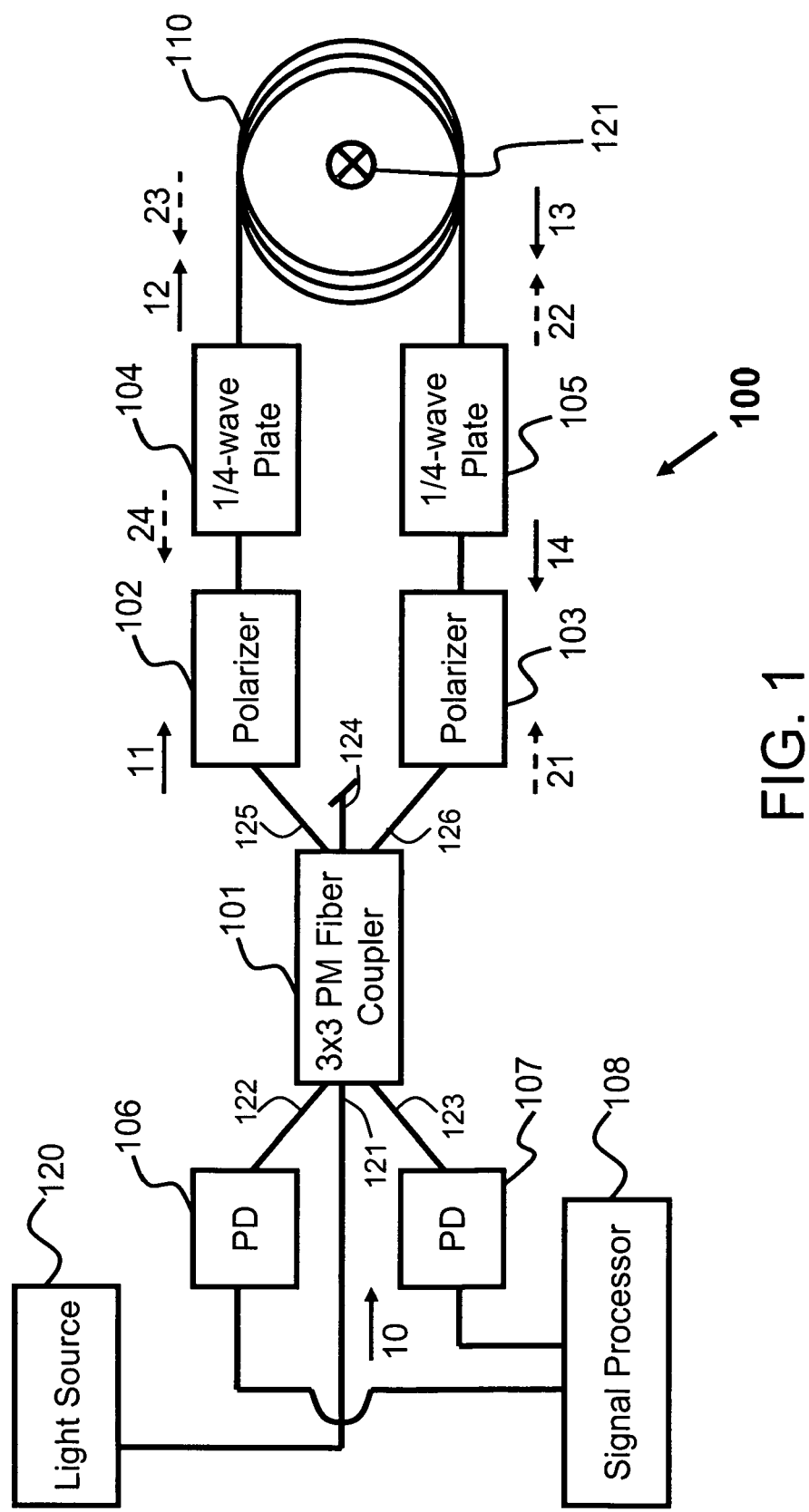
FIGS. 1-4 are block diagram illustrations of demonstrative configurations of all-fiber current sensors according to various embodiments of the present invention.

FIG. 1 is a block diagram illustration of a demonstrative configuration of a current sensor according to one embodiment of the present invention. Current sensor 100, or current sensing device 100 or simply device 100 as may be referred to hereinafter interchangeably, may be fiber based and may include a three-by-three (3×3) fiber coupler 101. Fiber coupler 101 may be able to maintain polarization state of light propagating therein, and may be made of, for example, polarization-maintaining (PM) fiber and therefore may be referred hereinafter as PM fiber coupler 101 or PM coupler 101. Specifically, PM fiber coupler 101 may include or be made of monolithically fused PM fibers and may have a phase difference of substantially close to 0 degree or 120 degrees among certain input and/or output ports. Further for example, PM fiber coupler 101 may be made of a set of, for example three, PM fibers arranged in a same plane rather than in a triangle, which are then monolithically fused together. PM fiber coupler 101 may have a first set of ports 121, 122, and 123 on one side (first side) and a second set of ports 124, 125, and 126 on the other side (second side) and, being a bidirectional device, may work either as a coupler or a splitter. Ports 121-126 may function or be used as input and/or output ports, and may include PM fibers as their pigtail fibers.

One or more optical signals launched into one or more ports of one side of PM fiber coupler 101 may be coupled, through propagating inside thereof having polarization states being properly maintained, to one or more ports of the other side of coupler 101. For example, a polarized optical input or optical signal from port 121 of the first side may be coupled to ports 124, 125 and/or 126 of the second side of coupler 101. More specifically, according to one embodiment, an optical signal or light from port 121 may be coupled to ports 125 and 126 in substantially equal amount and phase, which may have a phase difference of close to, or substantially close to, 120 degrees from that of port 121. In another embodiment, optical signals or lights coupled to ports 125 and 126 may be in substantially equal amount but with a phase difference close to, or substantially close to, 120 degrees with each other and with that of port 121. In yet another embodiment, optical signals or lights coupled to ports 125 and 126 may be in different amounts and with a phase difference close to, or substantially close to, either 120 degrees or 0 degree, which in turn may have a phase difference of close to, or substantially close to, 120 degrees from that of port 121.

In an opposite direction to that described above, polarized optical inputs or optical signals from ports 125 and 126 of the second side may be coupled to ports 121, 122 and/or 123 of the first side with their respective polarization states and relative phase relationship among the ports, as described above, being properly maintained.

According to one embodiment, the end of polarization-maintaining fiber at port 124 of the second side may be treated with an anti-reflection coating material and/or may be cut in an angle, such that back-reflections of light or optical signal from the end of the fiber may be substantially reduced, and/or preferably eliminated.

Current sensor 100 may include a light source 120, being connected to port 121 of the first side of coupler 101; first and second photon-detectors 106 and 107, being connected respectively to ports 122 and 123 of the same side; and a signal processor 108, being connected to both first and second photon-detectors 106 and 107. Current sensor 100 may also include first and second polarizers 102 and 103, being connected respectively to ports 125 and 126 of the second side of coupler 101; first and second quarter-wave plates 104 and 105, being connected respectively to first and second polarizers 102 and 103; and a current sensing fiber coil 110 that has two terminals (ends) being connected respectively to first and second quarter-wave plates 104 and 105. Connections between coupler 101, polarizers 102 and 103, quarter-wave plates 104 and 105, fiber coil 110, and photon-detectors 106 and 107 may be through their respective pigtail fibers, which may preferably be polarization-maintaining fibers, and may be made through splicing such as fusion splicing, optical connectors, and/or other currently available or future developed techniques.

It shall be noted that configuration of current sensor or current sensing device 100, according to embodiments of the present invention, may not be limited in those aspects as being demonstratively illustrated in FIG. 1 and various deviations and/or variations from the configuration in FIG. 1 may be considered as within the essence and spirit of the present invention. For example, first and second polarizers 102 and 103 may be connected in places other than between coupler 101 and quarter-wave plate 104 or quarter-wave plate 105. In one embodiment, first and second polarizers 102 and 103 may be connected between photon-detector 106 or photon-detector 107 and coupler 101, via port 122 or port 123 at the first side, as being illustrated in FIG. 2. Also for example, a polarizer (not shown) may be connected between light source 120 and port 121 for controlling polarization state of light being launched into port 121 of coupler 101. Further for example, an optical isolator (not shown) may be used between light source 120 and port 121 for reducing or preferably eliminating light travelling potentially backward from coupler 101 toward light source 120 which in certain instances may cause instability of the operation of light source 120.

During operation, light source 120 may launch an optical signal into port 121 of PM fiber coupler 101. The optical signal may preferably be a linearly polarized, for example, x-direction (perpendicular to this paper) polarized light 10. However, the present invention is not limited in this respect and other polarized or non-polarized light may be used as well. In one embodiment, a non-polarized light may become linearly polarized after passing through a polarizer (not shown) inserted between light source 120 and port 121 of coupler 101. Light 10 may subsequently split, inside coupler 101 which functions as a splitter in this instance, into two lights 11 and 21 of both x-direction polarized and lights 11 and 21 may propagate toward polarizers 102 and 103, via ports 125 and 126, respectively. In one embodiment, lights 11 and 21 may have substantially same phase. In another embodiment, lights 11 and 21 may have a phase difference substantially close to 120 degrees.

Polarizer 102 may align linearly polarized light 11, or convert a non-polarized light into linearly polarized light 11, with a direction, with respect to quarter-wave plate 104, such that after propagating through quarter-wave plate 104 linearly polarized light 11 becomes a right circularly polarized light 12. For example, polarization direction of light 11 may be aligned 45 degree relative to the main polarization axis or polarization direction of quarter-wave plate 104. Similarly, polarizer 103 may align linearly polarized light 21, or convert a non-polarized light into linearly polarized light 21, with a direction, with respect to quarter-wave plate 105, such that after propagating through quarter-wave plate 105 linearly polarized light 21 becomes a left circularly polarized light 22. For example, polarization direction of light 21 may be aligned −45 degree relative to the main polarization axis or polarization direction of quarter-wave plate 105.

Figure 2:
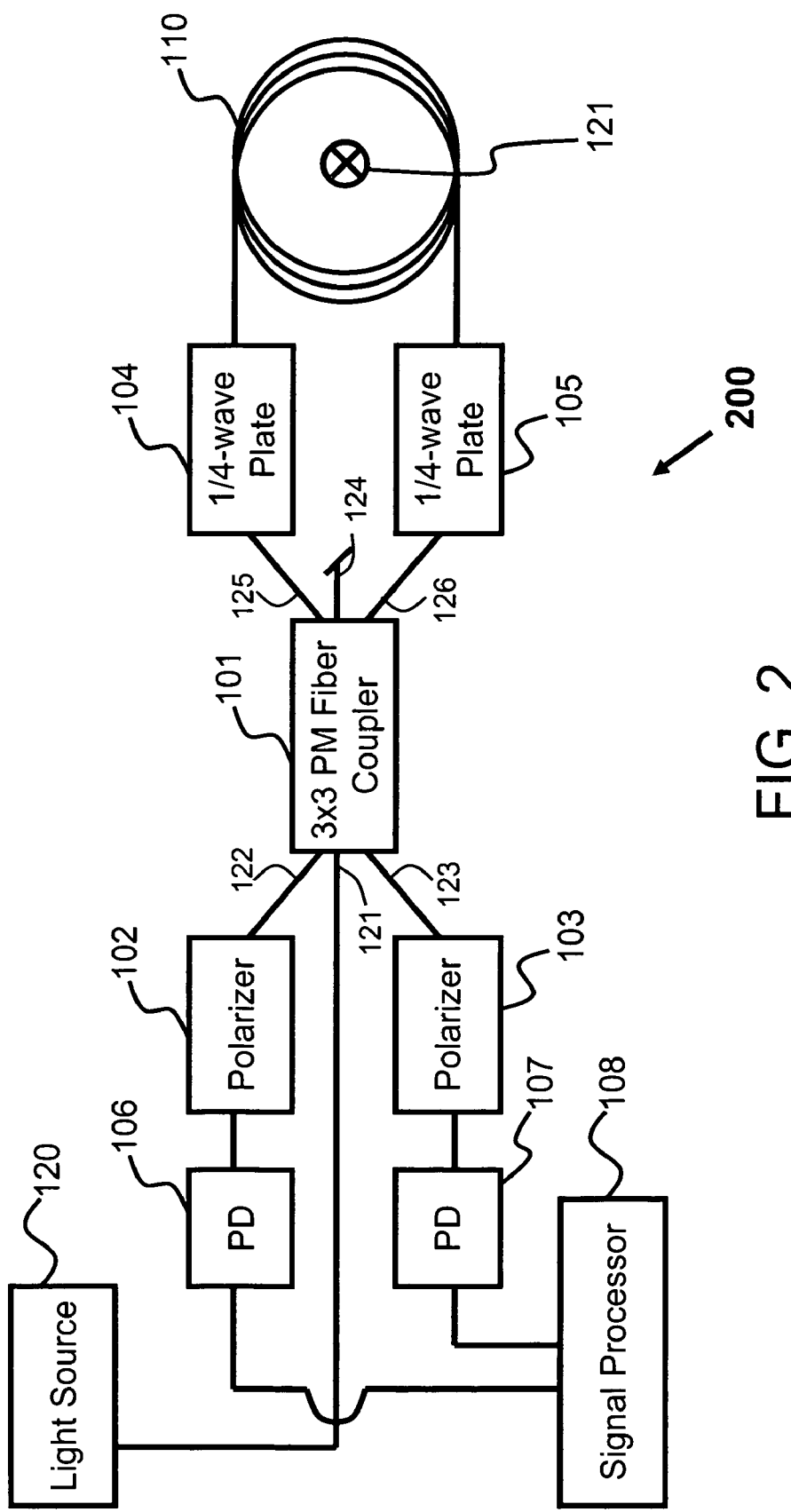

According to one embodiment of the present invention, as being illustrated in FIG. 2, where no polarizers are being used between quarter-wave plates 104 and 105 and coupler 101, connections between port 125 and quarter-wave plate 104, and between port 126 and quarter-wave plate 105 may be made with respect to their polarization directions, by adjusting polarization axis of the pigtail fibers, such that quarter-wave plate 104 may produce a right circularly polarized light from an input coming from port 125, and quarter-wave plate 105 may produce a left circularly polarized light from an input coming from port 126.

Current sensing fiber coil 110 may be spun around a medium such as a conductor or wire 121 that carries a current under measurement or detection or test. Current carried inside conductor 121 may create a magnetic field along the optical path of fiber coil 110 causing rotation of polarization direction of lights propagating inside, which is known in the art as Faraday effect. More specifically, right circularly polarized light 12, after propagating through fiber coil 110, may experience a first phase shift to become a right circularly polarized light 13. Right circularly polarized light 13 may then be converted, by quarter-wave plate 105, back into an x-direction linearly polarized light 14 carrying a first phase information which is directly related to the magnitude of current inside conductor 121.

Similarly, left circularly polarized light 22, after propagating through fiber coil 110 in a direction opposite to that of light 12, may experience a second phase shift to become a left circularly polarized light 23. The second phase shift may be different from the first phase shift. Left circularly polarized light 23 may then be converted, by quarter-wave plate 104, back into an x-direction linearly polarized light 24 carrying a second phase information which is also related to the magnitude of current inside conductor 121.

Linearly polarized lights 14 and 24 may subsequently be launched into coupler 101, via ports 126 and 125 respectively. Since phase differences among different ports of coupler 101 are substantially close to 120 degrees, as compared with 90 degrees of a conventional 2×2 fiber coupler, coupler 101 may create coherent interference between linearly polarized lights 14 and 24 without the need for additional phase shift elements or devices as required in a conventional fiber current sensor. Coming out of coupler 101, a combined light of lights 14 and 24 may then propagate along ports 122/123 to photon-detectors 106/107, wherein it is converted into a photocurrent.

According to one embodiment illustrated in FIG. 2, the use of polarizers 102/103 between photon-detectors 106/107 and coupler 101 ensures that lights of only the same polarization directions from ports 125/126 may interfere with each other and be detected by photon-detectors 106/107. Electrical outputs of photon-detectors 106/107 are connected to signal processor 108, which receives photocurrents from photon-detectors 106 and 107, processes information carried by the photocurrents, and determines the amount of current carried inside by conductor 121.

Figure 3:
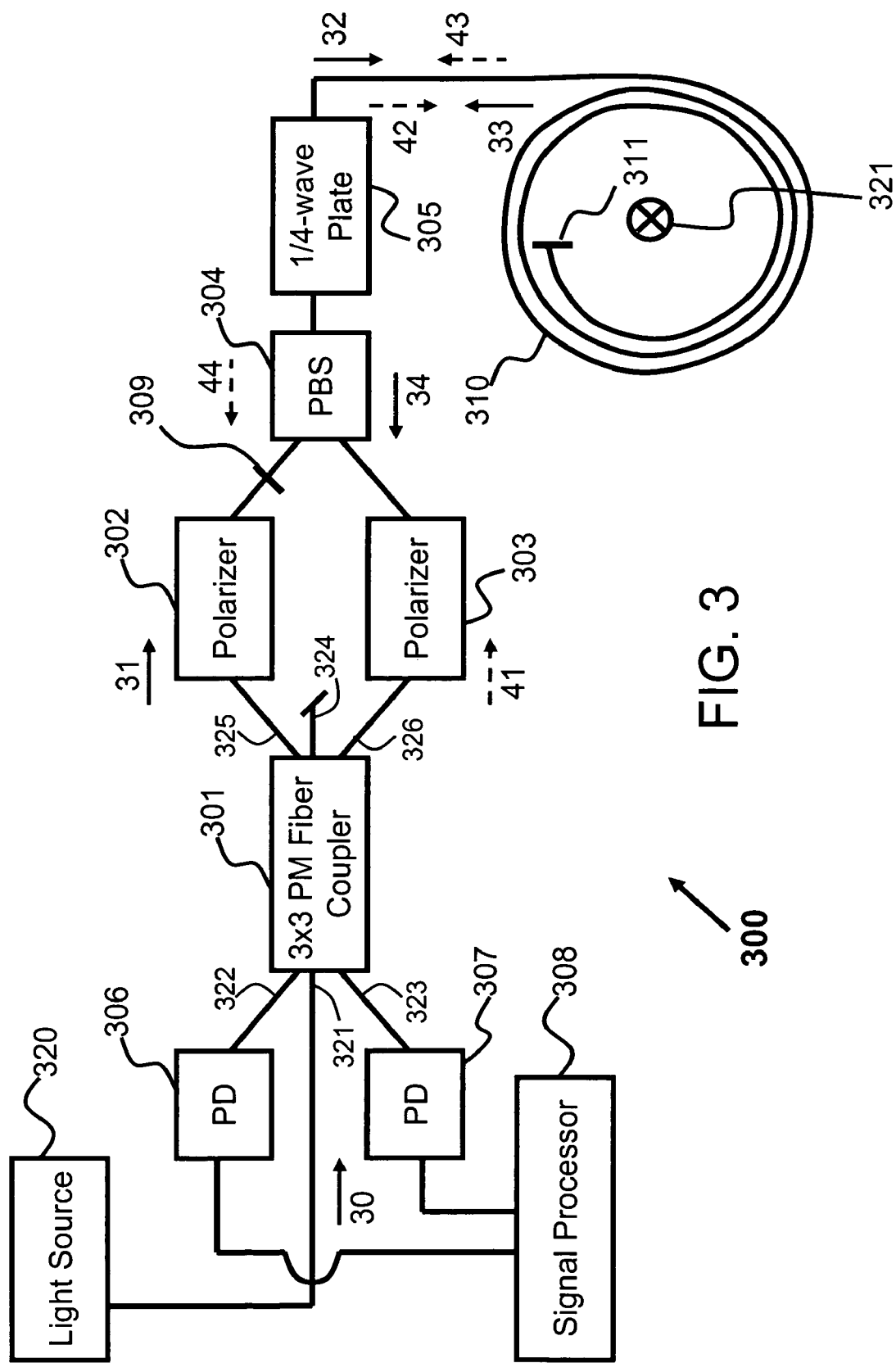

FIG. 3 is a block diagram illustration of a demonstrative configuration of a current sensor according to another embodiment of the present invention. Current sensor or current sensing device 300 may include a three-by-three (3×3) polarization-maintaining (PM) fiber coupler 301, which has a first set of ports 321, 322, and 323 on a first side and a second set of ports 324, 325, and 326 on a second side. Fiber coupler 300 is a bi-directional device working either as a splitter or a coupler, and ports 321-326 may be used as input and/or output ports, via their respective polarization-maintaining pigtail fibers. PM fiber coupler 301 may be substantially the same as PM fiber coupler 101 as illustrated in FIG. 1.

Current sensor 300 may include a light source 320, being connected to port 321 of the first side of coupler 301; first and second photon-detectors 306 and 307, being connected respectively to ports 322 and 323 of the same side; and a signal processor 308, being connected to electrical outputs of first and second photon-detectors 306 and 307. Current sensor 300 may also include first and second polarizers 302 and 303, being connected respectively to ports 325 and 326 of the second side of coupler 301; a polarization beam splitter (PBS) 304 connected to both first and second polarizers 302 and 303; a quarter-wave plate 305 connected PBS 304; and a current sensing fiber coil 310. Current sensing fiber coil 310 has one end connected to quarter-wave plate 305, and another end being properly terminated with a high-reflection coating material or a mirror such that optical signals propagating towards the end may be substantially reflected back into the fiber coil 310.

It shall be noted that configuration of current sensing device 300 of present invention is not limited in aspects demonstratively illustrated in FIG. 3, and various deviations and/or variations from the configuration in FIG. 3 may be considered as within the essence and spirit of present invention. For example, first and second polarizers 302 and 303 may be connected or placed in places other than between coupler 301 and PBS 304. According to one embodiment, first and second polarizers 302 and 303 may be connected or inserted between photon-detectors 306 and 307 and coupler 301, via ports 322 and 323 at the first side, as being illustrated in FIG. 4.

According to one embodiment of the present invention, connection between polarizer 302 and one input/output branch of PBS 304 may be made through a 90-degree rotation of polarization axis of their respective pigtail fibers. In other words, a polarization axis of pigtail fiber of polarizer 302 may be made 90 degree, at connection point 309, relative to that of pigtail fiber of PBS 304 such that, for example, an x-direction linearly polarized light coming from polarizer 302 may be launched into PBS 304 as a y-direction linearly polarized light.

Figure 4:
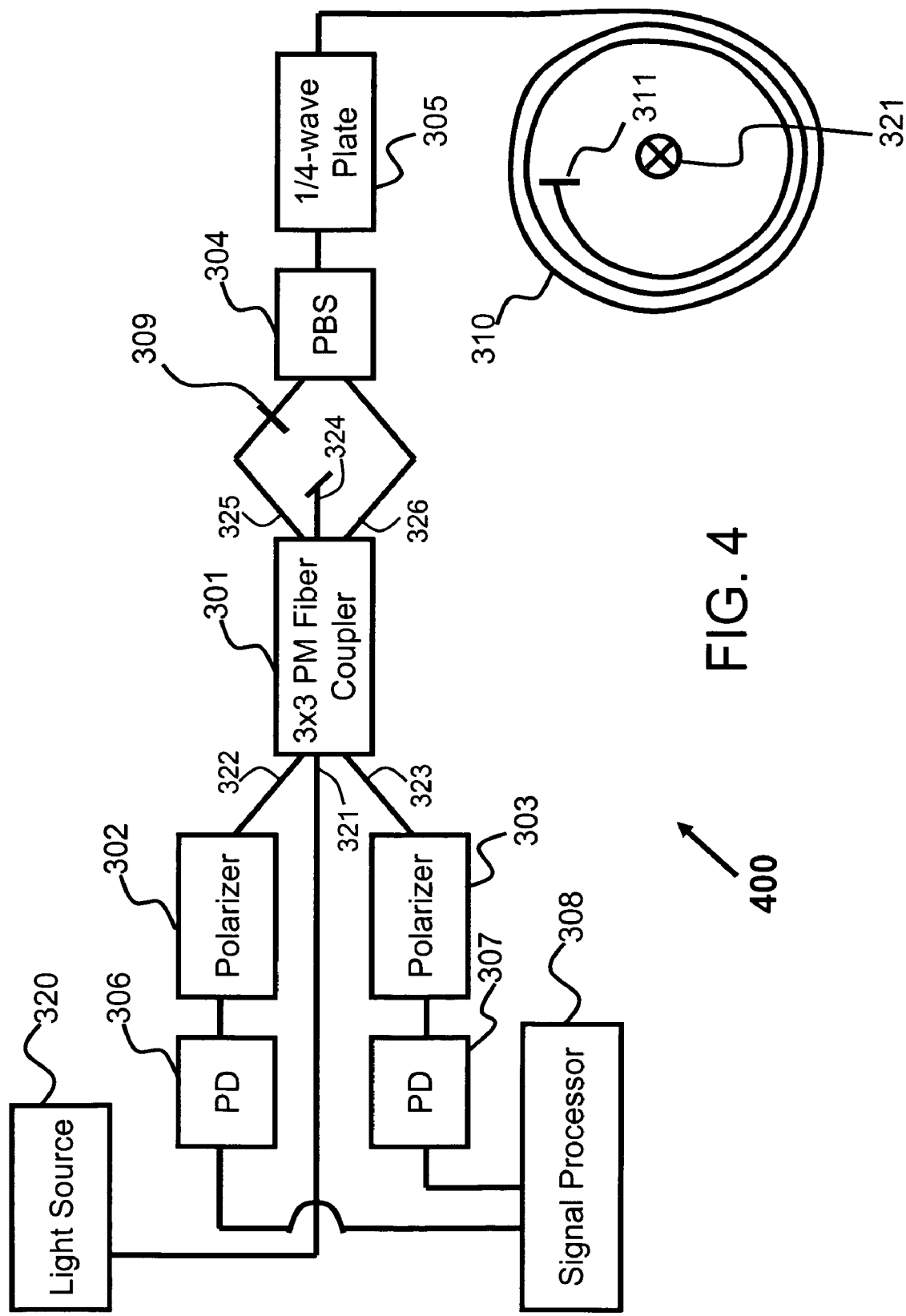

According to another embodiment as illustrated in FIG. 4, ports 325 and 326 of PM fiber coupler 301 may be connected directly to the input/output branches of PBS 304 without polarizers 302 and 303 as shown in FIG. 3. The connection of port 325 to PBS 304 may be through a 90-degree rotation of a polarization axis of its pigtail fiber relative to that of pigtail fiber of PBS 304, while the connection of port 326 to PBS 304 may be made without any rotation of polarization axis of their respective pigtail fibers. Pigtail fibers of PBS 304 may preferably include polarization-maintaining fibers.

During operation, light source 320 may launch an optical signal into port 321 of PM fiber coupler 301. The optical signal may preferably be a linearly polarized light, e.g., an x-direction polarized light 30. However, the present invention is not limited in this respect and other polarized or non-polarized light may be used as well. Light 30 may subsequently split inside coupler 301, which functions as a splitter, into two lights 31 and 41 of both x-direction linearly polarized propagating along ports 325 and 326 respectively. Polarizer 302 connected to port 325 may ensure that light 31 from port 325 is x-direction linearly polarized. Similarly, polarizer 303 may ensure that light 41 from port 326 is x-direction linearly polarized.

At point 309, light 31 from port 325 is rotated 90-degree or substantially close to 90-degree to become a y-direction linearly polarized light and is launched into a first branch of PBS 304. On the other hand, light 41 from port 326 remains as an x-direction linearly polarized light and is launched into a second branch of PBS 304 without polarization rotation or with a substantially close to 0-degree polarization rotation. PBS 304 may combine two mutually orthogonal linearly polarized lights and couple them into quarter-wave plate 305. More specifically, PBS 304 may couple x-direction linearly polarized light 41 and y-direction linearly polarized light 31 into quarter-wave plate 305.

PBS 304 may be connected through its pigtail fiber to quarter-wave plate 305 in such a way that quarter-wave plate 305 may convert a y-direction linearly polarized light, e.g. light 31, into a left circularly polarized light 32, and convert an x-direction linearly polarized, e.g. light 41, into a right circularly polarized light 42. Left and right circularly polarized lights 32 and 42 may propagate along fiber coil 310 respectively, and may experience different amount of rotations of their polarization states. The amount of rotation may be proportional to the current inside conductor 321 but in different magnitude.

Upon reaching the other end or terminal 311 of fiber coil 310, left circularly polarized light 32 may be reflected back by terminal 311 as light 33 to travel in opposite direction back toward quarter-wave plate 305. Right circularly polarized light 42 may be reflected back by terminal 311 as light 43 to travel toward quarter-wave plate 305 as well. Quarter-wave plate 305 may convert light 33 into an x-direction linearly polarized light 34, and convert light 43 into a y-direction linearly polarized light 44.

PBS 304 may direct x-direction linearly polarized light 34 to port 326, via polarizer 303, and y-direction linearly polarized light 44 to port 325, via polarizer 302. For current sensor 400 having a configuration illustrated in FIG. 4, PBS 304 may direct x-direction linearly polarized light 34 to port 326 and y-direction linearly polarized light 44 to port 325 directly. In directing y-direction linearly polarized light 44, light 44 is first converted into an x-direction linearly polarized light, through the 90-degree rotation of polarization axis of polarization-maintaining fiber at point 309, and then the x-direction linearly polarized light is launched into port 325.

Linearly polarized lights 34 and 44, which may carry different phase information resulting from the rotation of polarization direction caused by current inside conductor 321, may be launched into 3×3 PM fiber coupler 301. Since phase differences among different ports of coupler 301 are substantially close to 120 degrees, as compared with 90 degrees of a conventional 2×2 fiber coupler, PM fiber coupler 301 may create coherent interference between input lights 34 and 44. The interference may subsequently be detected by photon-detectors 306 and/or 307 via ports 322 and 323. Signal processor 308 may then receive photocurrents produced by photon-detectors 306 and/or 307, process the information carried by the photocurrents, and determine the amount of current carried by conductor 321.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A device comprising:
   a three-by-three (3×3) optical coupler made of polarization-maintaining (PM) fibers and thus being a 3×3 PM fiber coupler;
   a light source and at least one photon-detector connected to a first side of said 3×3 PM fiber coupler; and
   a fiber coil connected to a second side of said 3×3 PM fiber coupler,
   wherein said 3×3 PM fiber coupler comprises monolithically fused PM fibers and has a phase difference between at least two of a plurality of input/output ports of said first and second sides, said phase difference being substantially close to 120 degrees, and wherein said 3×3 PM fiber coupler is adapted to split an input light from said light source into first and second optical signals while maintaining their respective polarization directions; and is adapted to cause coherent interference of third and fourth optical signals related respectively to the first and second optical signals and received from said fiber coil.

2. The device of claim 1, comprising:
   a first quarter-wave plate connected between a first end of said fiber coil and a first port of said second side of said 3×3 PM fiber coupler; and
   a second quarter-wave plate connected between a second end of said fiber coil and a second port of said second side of said 3×3 PM fiber coupler,
   wherein said first and second quarter-wave plates are adapted to convert said first and second optical signals into first and second circularly polarized lights respectively to be provided to said fiber coil; said fiber coil is adapted to convert said first and second circularly polarized lights propagating therein in opposite directions into third and fourth circularly polarized lights respectively; and said first and second quarter-wave plates are additionally adapted to convert said third and fourth circularly polarized lights, from said fiber coil, into said third and fourth optical signals respectively; and wherein a third port of said second side of said 3×3 PM fiber coupler is treated with an anti-reflection coating.

3. The device of claim 2, comprising:
   a first polarizer connected between said first quarter-wave plate and said first port of said second side of said 3×3 PM fiber coupler; and
   a second polarizer connected between said second quarter-wave plate and said second port of said second side of said 3×3 PM fiber coupler,
   wherein said first polarizer is adapted to convert said first optical signal into a first linearly polarized light, and said second polarizer is adapted to convert said second optical signal into a second linearly polarized light.

4. The device of claim 1, wherein said at least one photon-detector is a first photon-detector connected to a first port of said first side of said 3×3 PM fiber coupler, further comprising:
- a second photon-detector connected to a second port of said first side of said 3×3 PM fiber coupler; and
- a signal processor connected to the first and second photon-detectors,
- wherein said signal processor is adapted to process photocurrents received from said first and second photon-detectors thereby determining an amount of electric current that passes through an area surrounded by said fiber coil.

5. The device of claim 4, further comprising:
- a first polarizer connected between said first photon-detector and said first port of said first side of said 3×3 PM fiber coupler; and
- a second polarizer connected between said second photon-detector and said second port of said first side of said 3×3 PM fiber coupler.

6. The device of claim 1, comprising a quarter-wave plate connected between said fiber coil and said second side of said 3×3 PM fiber coupler,
- wherein said quarter-wave plate is adapted to convert said first and second optical signals into first and second circularly polarized lights respectively to be provided to said fiber coil; said fiber coil is adapted to convert said first and second circularly polarized lights into third and fourth circularly polarized lights respectively; and said quarter-wave plate is additionally adapted to convert said third and fourth circularly polarized lights, back from said fiber coil, into said third and fourth optical signals respectively.

7. The device of claim 6, wherein said quarter-wave plate is connected to a first end of said fiber coil, and wherein a second end of said fiber coil is coated with a highly reflective material causing increase in back-reflections of light at said second end of said fiber coil.

8. The device of claim 6, comprising a polarization beam splitter (PBS) connected between said quarter-wave plate and first and second ports of said second side of said 3×3 PM fiber coupler, said PBS being adapted to couple and/or split optical signals of first and second polarization directions,
- wherein said first and second ports of said second side of said 3×3 PM fiber coupler are connected to said PBS in such a way that said PBS is adapted to couple said first and second optical signals to said fiber coil at said first and second polarization directions, and split said third and fourth optical signals from said fiber coil into said first and second ports of said second side of said 3×3 PM fiber coupler at said first and second polarization directions.

9. The device of claim 8, wherein said first port of said second side of said 3×3 PM fiber coupler is connected to said PBS through a substantially 90-degree rotation of polarization direction, and said second port of said second side of said 3×3 PM fiber coupler is connected to said PBS through a substantially 0-degree rotation of polarization direction.

10. The device of claim 8, comprising:
- a first polarizer connected between a first port of said PBS and said first port of said second side of said 3×3 PM fiber coupler; and
- a second polarizer connected between a second port of said PBS and said second port of said second side of said 3×3 PM fiber coupler,
- wherein said first polarizer is adapted to convert said first optical signal into a first linearly polarized light to launch into said first port of said PBS in said first polarization direction, and said second polarizer is adapted to convert said second optical signal into a second linearly polarized light to launch into said second port of said PBS in said second polarization direction.

11. The device of claim 10, wherein said photon-detector is a first photon-detector connected to a first port of said first side of said 3×3 PM fiber coupler, comprising:
- a second photon-detector connected to a second port of said first side of said 3×3 PM fiber coupler; and
- a signal processor connected to the first and second photon-detectors,
- wherein said signal processor is adapted to process photocurrents received from said first and second photon-detectors thereby determining an amount of electric current that passes through an area surrounded by said fiber coil.

12. The device of claim 8, comprising a polarizer connected between said photon-detector and a first port of said first side of said 3×3 PM fiber coupler.

13. The device of claim 12, wherein said photon-detector is a first photon-detector and said polarizer is a first polarizer, comprising:
- a second photon-detector and a second polarizer, said second photon-detector being connected to said second polarizer, and said second polarizer being connected to a second port of said first side of said 3×3 PM fiber coupler; and
- a signal processor connected to the first and second photon-detectors,
- wherein said signal processor is adapted to process photocurrents received from said first and second photon-detectors thereby determining an amount of electric current that passes through an area surrounded by said fiber coil.

14. A current sensing device comprising:
- a three-by-three (3×3) polarization-maintaining (PM) fiber coupler;
- first and second photon-detectors connected to first and second ports of a first side of said 3×3 PM fiber coupler;
- first and second quarter-wave plates connected to first and second ports of a second side of said 3×3 PM fiber coupler;
- a fiber coil connected to said first and second quarter-wave plates;
- a signal processor connected to said first and second photon-detectors; and
- a light source connected to a third port of said first side of said 3×3 PM fiber coupler;
- wherein said 3×3 PM fiber coupler comprises monolithically fused PM fibers and is adapted to split an input light from said light source into first and second optical signals with a phase difference substantially close to 0 degree or 120 degrees, said first and second quarter-wave plates are adapted to convert said first and second optical signals into first and second circularly polarized lights respectively; and said fiber coil is adapted to convert said first and second circularly polarized lights propagating therein in opposite directions into third and fourth circularly polarized lights respectively, and
- wherein said first and second quarter-wave plates are additionally adapted to convert said third and fourth circularly polarized lights into third and fourth optical signals respectively; and said 3×3 PM fiber coupler is additionally adapted to cause coherent interference of said third and fourth optical signals, which are detected by said first and second photon-detectors.

15. The current sensing device of claim 14, comprising:
a first polarizer connected between said first quarter-wave plate and said first port of said second side of said 3×3 PM fiber coupler; and
a second polarizer connected between said second quarter-wave plate and said second port of said second side of said 3×3 PM fiber coupler,
wherein said first polarizer is adapted to convert said first optical signal into a first linearly polarized light to provide to said first quarter-wave plate, and wherein said second polarizer is adapted to convert said second optical signal into a second linearly polarized light to provide to said second quarter-wave plate.

16. The current sensing device of claim 14, comprising:
a first polarizer connected between said first photon-detector and said first port of said first side of said 3×3 PM fiber coupler; and
a second polarizer connected between said second photon-detector and said second port of said first side of said 3×3 PM fiber coupler.

17. A current sensing device comprising:
a three-by-three (3×3) polarization-maintaining (PM) fiber coupler;
first and second photon-detectors connected to first and second ports of a first side of said 3×3 PM fiber coupler;
a polarization beam splitter (PBS) connected to a first port of a second side of said 3×3 PM fiber coupler through a substantially 90-degree rotation of polarization direction, and to a second port of said second side of said 3×3 PM fiber coupler through a substantially close to 0-degree rotation of polarization direction;
a quarter-wave plate connected to said PBS;
a fiber coil connected to said quarter-wave plate;
a signal processor connected to said first and second photon-detectors; and
a light source connected to a third port of said first side of said 3×3 PM fiber coupler;
wherein said 3×3 PM fiber coupler comprises monolithically fused fibers and is adapted to split an input light from said light source into first and second optical signals with a phase difference substantially close to 0 degree or 120 degrees; said PBS is adapted to couple said first and second optical signals to said quarter-wave plate at a first and a second polarization direction, said quarter-wave plate is adapted to convert said first and second optical signals into first and second circularly polarized lights respectively; and said fiber coil is adapted to convert said first and second circularly polarized lights into third and fourth circularly polarized lights respectively propagating toward said quarter-wave plate, and
wherein said quarter-wave plate is additionally adapted to convert said third and fourth circularly polarized lights into third and fourth optical signals respectively; said PBS is additionally adapted to split said third and fourth optical signals into said first and second ports of said second side of said 3×3 PM fiber coupler; and said 3×3 PM fiber coupler is additionally adapted to cause coherent interference of said third and fourth optical signals, which are detected by said first and second photon-detectors.

18. The current sensing device of claim 17, comprising:
a first polarizer connected between said first port of said PBS and said first port of said second side of said 3×3 PM fiber coupler; and
a second polarizer connected between said second port of said PBS and said second port of said second side of said 3×3 PM fiber coupler,
wherein said first polarizer is adapted to convert said first optical signal into a first linearly polarized light to provide to said PBS at said first polarization direction, and wherein said second polarizer is adapted to convert said second optical signal into a second linearly polarized light to provide to said PBS at said second polarization direction.

19. The current sensing device of claim 17, comprising:
a first polarizer connected between said first photon-detector and said first port of said first side of said 3×3 PM fiber coupler; and
a second polarizer connected between said second photon-detector and said second port of said first side of said 3×3 PM fiber coupler.

* * * * *